United States Patent

Weber

[15] 3,638,038

[45] Jan. 25, 1972

[54] TONE DETECTOR CONTROL CIRCUIT

[72] Inventor: Vernon F. Weber, Elmhurst, Ill.

[73] Assignee: GTE Automatic Electric Laboratories Incorporated, Northlake, Ill.

[22] Filed: Oct. 12, 1970

[21] Appl. No.: 80,001

[52] U.S. Cl. ..............................307/233, 307/246, 307/255, 307/288, 307/295, 328/138, 328/140, 328/167

[51] Int. Cl. ..........................................................H03k 5/20

[58] Field of Search ..................307/233, 246, 255, 271, 288, 307/295; 328/138, 140, 167

[56] References Cited

UNITED STATES PATENTS

| | | | |
|---|---|---|---|
| 3,061,742 | 10/1962 | Harrison | 307/295 X |
| 3,098,939 | 7/1963 | Clapper | 307/288 X |
| 3,131,258 | 4/1964 | O'Neill, Jr. | 307/233 X |
| 3,235,750 | 2/1966 | Anderson et al. | 307/255 |
| 3,551,699 | 12/1970 | Karwacki | 307/255 X |
| 3,582,799 | 6/1971 | Reid | 307/246 X |

*Primary Examiner*—Stanley T. Krawczewicz
*Attorney*—Cyril A. Krenzer, K. Mullerheim and B. E. Franz

[57] ABSTRACT

A tone detector control circuit arrangement for detecting a tone of a particular frequency and level. The circuit includes an input circuit, a twin "T" active filter, a buffer amplifier and an alternating current level detector. The level detector is a form of monostable circuit with a feedback path including a capacitor, and the signal is applied to one side of the capacitor whereby the circuit may be maintained in the conductive state during the presence of the tone.

8 Claims, 1 Drawing Figure

PATENTED JAN 25 1972
3,638,038
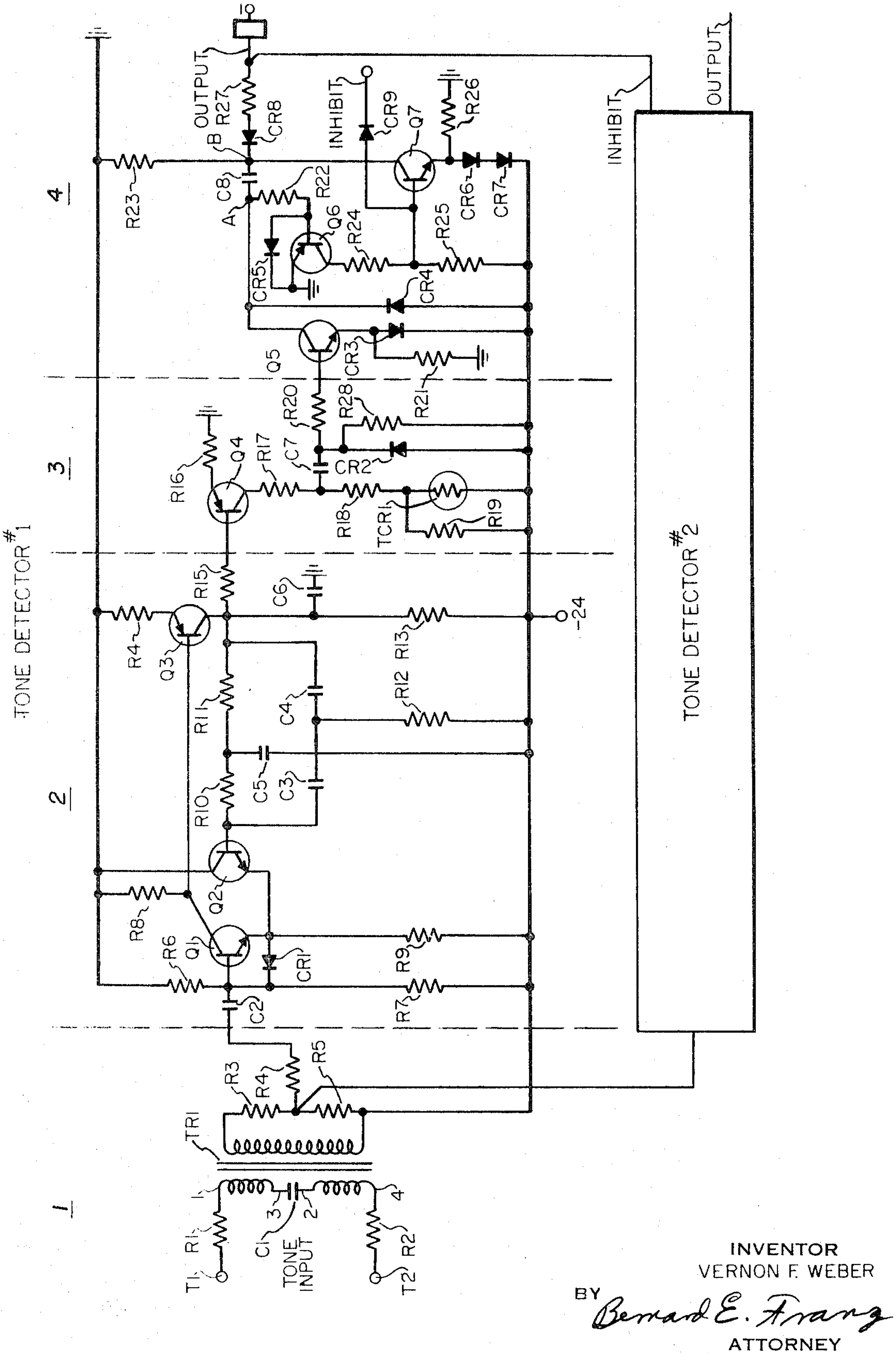
INVENTOR
VERNON F. WEBER
BY Bernard E. Franz
ATTORNEY

TONE DETECTOR CONTROL CIRCUIT

BACKGROUND OF THE INVENTION

1. Field of the Invention

This invention relates generally to switching circuitry and more particularly to improved automatic switching control circuitry operative in response to an AC signal of a particular level and frequency to supply a DC control signal to other circuitry.

2. Description of the Prior Art

While the prior art has many voltage level detectors and voltage comparison circuits one of the big disadvantages of the prior art circuits is the response time. Basically these prior art circuits for AC level detection consist of a diode rectifier and a transistor switch where, in order to keep the transistor switch operated continuously, a relatively large filter capacitor must be used in the rectifier circuit. This capacitor takes time to charge and discharge. Thus both the operate and release times of the detector are very long. For example, at 620 Hz. these times are in the order of about 500 milliseconds. At 20 Hz. these times are of course considerably longer and thus reduce the number of tone present tests that can be performed in a given time period.

SUMMARY OF THE INVENTION

Accordingly, it is an object of the present invention to provide an improved tone and level detector circuit having a greatly decreased response time for providing a direct current output.

This is accomplished by the use of a unique complementary transistor circuit following the input amplifier and filter sections. A pulse input to this circuit is from a buffer amplifier stage following the filter sections.

The circuit functions to render both transistors of the complementary circuit simultaneously conductive in response to unipolar pulses to the base of one of the transistors, whose output is coupled to the base of the other transistor to cause it to become conductive. The output of the other transistor is so coupled through a capacitor, to the one transistor to reinforce the unipolar pulses to increase the conductivity thereof. This capacitor in the positive feedback path under single pulse conditions would become charged and cause the one transistor to cease conduction. This operation is similar to a monostable circuit to the extent of its initial operation; however, unlike a monostable circuit which cannot be maintained in its conductive state but must return to its nonconductive state before it can again be turned on, this circuit will remain in its conductive "on" state as long as the incoming pulses are present. The unipolar pulses are applied to the one transistor side of the capacitor to maintain it discharged and thus maintain the circuit continuously in conduction for the duration of the input pulses. The output of the other transistor is then connected to a utilization circuit which can be a relay or a resistor whose potential may be scanned for determining the status of this circuit.

BRIEF DESCRIPTION OF THE DRAWING

The novel features which it is believed are characteristic of the invention, both as to its organization and method of operation, will be more apparent from the following detailed description taken in conjunction with the accompanying drawing, which comprises a schematic of the circuit of this invention.

DESCRIPTION OF THE PREFERRED EMBODIMENT

Referring to the drawing there is shown a complete tone detector circuit consisting of an input circuit 1, a band-pass filter 2, a temperature compensating buffer amplifier circuit 3 and an AC level detector 4.

Input Circuit: This circuit includes the terminals T1 and T2 across which the signal is applied. Resistors R1 and R2 along with resistors R3, R4, and R5 with transformer TR1 serve to provide a balanced input circuit and to set the initial signal level to the filter section. Capacitor C1 is series with the primary windings 1–3 and 2–4 of transformer TR1 is used to block the DC component.

Capacitor C2 couples the signal to the filter circuit 2 at its input that is the base of transistor Q1.

Filter Circuit: This circuit is a twin "T" active filter, with transistors Q1, Q2 and Q3 connected as a direct coupled amplifier. A twin "T" network consisting of resistors R10, R11 and R12 and capacitors C3, C4 and C5 is wired into a negative feedback path to transistor Q1. With the proper values of R and C, this network attenuates one frequency, the notch frequency, and passes all other frequencies. Thus, when placed in the negative feedback path of the amplifier, the filter supplies a negative feedback at all frequencies except the notch frequency. The gain of the amplifier thus approaches a maximum at the notch frequency, and a minimum at the other frequencies on each side of the notch frequency.

Transistor Q1 is used in a circuit similar to a common emitter circuit, except for the resistor R9 in the emitter to negative battery circuit. Resistors R6 and R7 form a voltage divider for providing the proper bias to the base of the transistor. Resistor R8 complete the emitter collector path to the positive potential source. The function of diode CR1 is to limit the negative base to emitter voltage to a value below 0.7 volts. In operation transistor Q1 amplifies the alternating current input to its base, with the output taken from the collector by direct coupling to the base of transistor Q3.

Transistor Q3 is connected in a normal common emitter circuit configuration which provides a fairly low output impedance for feeding the twin "T" network. It has its emitter connected to the positive potential via resistor R14 and its collector to the negative potential via resistor R13. The twin "T" filter input side is connected from the collector of Q3 to the resistive arm branch or "T" resistor R11 and to the capacitive arm branch or "T" capacitor C4. The twin "T" filter resistive branch consists of resistors R10 and R11 in series and a shunt capacitor C5 connected from the junction of the two resistors to the negative battery line, and the capacitive branch consists of capacitors C4 and C3 in series and a shunt resistor R12 connected from the junction of the two capacitors to the negative battery line. The remaining terminals of resistor R10 and capacitor C3 forming the output of the twin "T" filter are connected to the base of transistor Q2.

Transistor Q2 is connected in an emitter follower configuration to provide a higher impedance to the filter whose output it serves to amplify. The emitter of Q2 is connected directly to the emitter of Q1, while its collector is connected to the positive source.

Buffer Amplifier: Resistor R15 connected from the collector of Q3 to the base of transistor Q4 couples the output of the filter section to the buffer amplifier and also further isolates the output of the filter from Q4. Resistor R16 from the positive source to the emitter of transistor Q4 is of such a value as to provide the proper signal level to the detector. Resistors R17, R18, R19 and TCR1 form a temperature-compensating network to keep the bandwidth and sensitivity constant regardless of temperature. For example, at low temperatures the output of the filter drops and the sensitivity of the level detector decreases. However, the resistance of TCR1 increases considerably, so that the output from the buffer amplifier increases to a point which compensates for the two adverse effects.

Level Detector: The output of the buffer amplifier stage is coupled via capacitor C7 and resistor R20 to the base of the signal injector transistor Q5, whose emitter is clamped to the negative bus via diode CR3 and biased by resistor R21 from the ground potential. The collector of transistor Q5 is coupled to the junction of resistor R22 and capacitor C8 and via resistor R22 to the base of transistor Q6.

Transistors Q6 and Q7 are arranged in a form of monostable multivibrator with the base of transistor Q6 coupled to the collector of transistor Q7 via resistor R22 and capacitor C8. Resistor R23 connects the collector of transistor Q7 to ground, and a diode CR8 also connected to the collector of transistor Q7 supplied the output. The base of transistor Q7 is connected to the collector of transistor Q6 via resistor R24, with the proper operating voltage being supplied via resistor R25 connected from the negative battery bus to the base of transistor Q7. The emitter of transistor Q6 is connected to ground while the emitter of transistor Q7 is connected to ground via a resistor R26 and clamped to negative bus via diodes CR6 and CR7.

During operation when an AC signal is applied to the input at capacitor C7 and the instantaneous positive voltage reaches about 0.6 volt, transistor Q5 conducts. Capacitor C8 begins to charge through resistor 23 such that the A side of capacitor C8 is negative. When the voltage across capacitor C8 reaches a certain level, current flows from the base of transistor Q6 through resistor R22 to the A side of capacitor C8 which begins to turn on transistor Q6. Current then flows through resistors R24 and R25, which begin to turn on transistor Q7, because there is now a voltage drop across resistor R25 to make the base of transistor Q7 more positive. Current flows through resistor R23, transistor Q7, and diodes CR6 and CR7 to apply a negative voltage to the B side of capacitor C8. The voltage adds to the previous voltage on capacitor C8, and thus more current is pulled from the base of transistor Q6. This action is cumulative until transistors Q6 and Q7 are turned completely. Since transistors Q5 and Q7 are turned on, capacitor C8 now has no charge on it. When the input instantaneous AC voltage at capacitor C7 drops below the threshold level, transistor Q5 stops conducting. However, transistor Q6 remains on due to its base current flowing from ground, through resistor R22, capacitor C8, and transistor Q7. When the voltage across capacitor C8 drops to a certain level, the base current is insufficient to hold transistor Q6 in the on state and it is turned off. The current through resistors R24 and R25 decreases, which decreases the collector current of transistor Q7. The collector voltage thus approaches ground (i.e., is less negative). This action is again cumulative until the collector to ground voltage at transistor Q7 added to the voltage across capacitor C8 reaches zero, and finally a positive value. Thus transistors Q6 and Q7 are turned off. When the next positive half of the input wave occurs, the complete cycle is repeated. However, if the RC time constant of resistor R22 and capacitor C8 is approximately equal to the period of the input frequency, the base current of transistor Q6 is continuous, and the output at the collector of transistor Q7 is constant. The reason that the base current of transistor Q6 is continuous is that each positive half of the input wave discharges capacitor C8. This action is as follows. When transistor Q5 is not conducting, capacitor C8 is charging, and the A side of it is positive. When transistor Q5 is conducting, positive current flows from the A side of capacitor C8 through transistor Q5, diode CR3, resistor R25, the base-to-collector diode of transistor Q7, and thus to the B side of capacitor C8.

Diode CR2 is used to discharge capacitor C7 since current flows only during positive pulses. Diode CR3, resistors R21 and R28 apply a bias on transistor Q5 so that it is less susceptible to be turned on by noise. Resistor R20 increases the input impedance to transistor Q5. Diode CR4 prevents the collector of transistor Q5 from going negative with respect to its emitter. This condition could occur at the moment that transistor Q7 switches on, since the negative voltage drop across resistor R23 adds to the negative drop across capacitor C8.

Diode CR5 prevents the base of transistor Q6 from going positive when the level detector returns to the off state.

Resistor 27 limits the current through transistor Q7 to a safe value in case the output lead is shorted to ground. As shown in the drawing the output lead is connected to a relay. Diode CR8 is used only when two tone detectors are used to detect different frequencies from the same source; their two output leads thus can be connected together to form an OR gate.

The INHIBIT lead, diodes CR6, CR7 and CR9 and resistor R26 are used on the tone detector when two tones from the same input must be detected but are of different levels for example low level busy and high level transmission tone. For example, when checking a trunk, a special number is dialed which is supposed to apply a 1 kHz. test tone at the distant office. If this lien is busy, the usual busy tone is returned. When this testing is done automatically by the Maintenance and Control Center of an Electronic Exchange the 1 kHz. and the busy tone detectors are connected across the line. Since the busy tone detector must be capable of detecting a lever as low as −36 dbm., it could be operated by the relatively high-level (0 dbm.) 1 kHz. test tone. Thus the inhibit lead of the low-level busy tone detector is connected to the output lead of the 1 kHz. tone detector. If the 1 kHz. tone detector operates, it inhibits or prevents the busy tone detector 2 from operating. Diodes CR6 and CR7 and resistor R26 applies bias to transistor Q7 so that it can be cut off when its inhibit lead is connected to the output of another detector circuit. Diode CR9 isolates the base of transistor Q7 from the collector of transistor Q7 is the detector which is doing the inhibiting.

What is claimed is:

1. An alternating current level detector having a direct current output comprising: a source of operating potential, a first transistor of a first conductivity type and a second transistor of the opposite conductivity type, each connected in an operating circuit to said source of operating potentials, a bias means connected in said first transistor operating circuit, said second transistor connected to said bias means for operatively biasing said second transistor upon conduction by said first transistor, a feedback means including a capacitor connected from said second transistor to said first transistor, signal input means coupled to the first-transistor side of said capacitor in said feedback means operative to render said first transistor conductive upon the application of an AC signal via said input means, means including the continued presence of a signal via said input means and said capacitor to maintain both said transistors in the conductive state, and output means connected to said second transistor effective upon operation of said second transistor to present a direct current potential thereon.

2. An alternating current level detector as claimed in claim 1 wherein said output means includes rectifier means for isolating external conditions from said second transistor.

3. An alternating current level detector as claimed in claim 2 wherein said first transistor is of a PNP-conductivity type and said second transistor is of an NPN-conductivity type.

4. An alternating current level detector as claimed in claim 1 wherein said first transistor is of a PNP-conductivity type and said second transistor is of an NPN-conductivity type.

5. In a system wherein predetermined frequencies and magnitudes of alternating current signals are utilized to automatically activate auxiliary apparatus, an automatic switching control circuit comprising: signal input means, a positive and a negative source of energizing potential, a frequency-discriminating means having an output and an input means, said input means connected to said signal input means, an alternating current level detecting means comprising, a first and a second PNP- and a third NPN-transistor, each said transistor having a base, an emitter and a collector electrode, means coupling said base electrode of said first transistor to said frequency-discriminating means output, biasing means coupled to the base and emitter electrodes of said first PNP-transistor to effect class C operation thereof upon the application of a signal from said signal input means through said frequency-discriminating means, and a circuit configuration comprising, means connecting said second PNP-transistor emitter to said positive energizing source, a first resistor connected to said PNP-transistor collector, a second resistor serially connected between said first resistor and said negative source, a third resistor and a capacitor serially connected between said second PNP-transistor base and said NPN-transistor collector, a first diode means connected with its cathode end to the positive source and its anode end to the base of said second PNP-transistor, a second diode means with its anode connected to the emitter of said third NPN-transistor and its cathode end connected to said negative source, means connecting the base of said NPN-transistor to the junction of said first and second resistors to bias said third transistor into a conductive state upon said second transistor conducting, means coupling said first transistor collector to the connection between said third resistor and said capacitor to operate said second transistor to a conductive state, whereby said third transistor is turned on, and output means coupled to said third transistor collector effective to present a direct current output to auxiliary apparatus.

6. In a system as claimed in claim 5 wherein said output means includes rectifier means for isolating external conditions from said third transistor.

7. In a system as claimed in claim 6 further including a second automatic switching control circuit as claimed in claim 6 for the first said control circuit but responsive to another frequency and means connecting said output means of each said control circuit together whereby either of said control circuits may activate said same external apparatus.

8. In a system as claimed in claim 7 wherein said second control circuit further includes diode means with the anode end connected to said third transistor base and said cathode end to said third transistor collector of said first control circuit.

* * * * *